(12) United States Patent
Ghandehari et al.

(10) Patent No.: US 6,501,555 B1
(45) Date of Patent: Dec. 31, 2002

(54) OPTICAL TECHNIQUE TO DETECT ETCH PROCESS TERMINATION

(75) Inventors: Kouros Ghandehari, Santa Clara, CA (US); Bhanwar Singh, Morgan Hill, CA (US); Angela T. Hui, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 121 days.

(21) Appl. No.: 09/773,954

(22) Filed: Feb. 1, 2001

(51) Int. Cl.[7] .............................................. G01B 11/28
(52) U.S. Cl. ...................... 356/630; 356/631; 356/632; 356/394; 356/432; 356/434
(58) Field of Search ................. 356/394, 630, 356/631, 632, 432, 434, 435, 436, 440, 316; 250/548; 438/700, 701, 710, 14, 16; 216/60

(56) References Cited

U.S. PATENT DOCUMENTS

| | | | |
|---|---|---|---|
| 4,454,001 A | * | 6/1984 | Sternheim et al. .......... 156/626 |
| 4,462,860 A | * | 7/1984 | Szmanda ..................... 156/626 |
| 5,427,878 A | * | 6/1995 | Corliss ......................... 430/30 |
| 6,081,334 A | * | 6/2000 | Grimbergen et al. ........ 356/357 |

OTHER PUBLICATIONS

Vallant et al., "Monolayer–Controlled Deposition of Silicon Oxide Films on Gold, Silicon, and Mica Substrates by Room–Temperature Adsorption and Oxidation of Alkylsiloxane Monolayers," Journal of Physical Chemistry B, V.104, 2000, pp. 5309–5317.

* cited by examiner

*Primary Examiner*—Georgia Epps
*Assistant Examiner*—M. Hasan
(74) *Attorney, Agent, or Firm*—Foley & Lardner

(57) ABSTRACT

The disclosure describes an exemplary method of detecting a process end point during etching in the fabrication of an integrated circuit. This method can include receiving a reference signal indicative of an intensity of a light source, collecting a reflection signal reflected off a surface of an integrated circuit wafer, and comparing the reference signal and the reflection signal to locate absorption bands, the absorption band being indicative of a process end point.

13 Claims, 4 Drawing Sheets

OPTICAL TECHNIQUE TO DETECT ETCH PROCESS TERMINATION

FIELD OF THE INVENTION

The present specification relates to the fabrication of integrated circuits. More specifically, the present specification relates to an optical technique to detect the termination of a dry etch or plasma etch process using the reflected or absorbed signal in absorbing regions of chemicals or surfaces exposed to the beam at process termination.

BACKGROUND OF THE INVENTION

Scatterometry has been developed to characterize critical dimensions (CDs) of topographic integrated circuit (IC) structures of both photoresist before etch and circuit features in relief after etch. Scatterometry can include using a light beam over varying angles of to incidence with a broad band source that is typically in the spectral range of 230 nm to 850 nm and is used to illuminate a target area of 50 $\mu$m to 100 $\mu$m. The target area (scatterometry target) is not necessarily part of the IC and is typically in the scribe area of the wafer or other unused portion of the wafer. The wafer is cut in the scribe area to form IC chips. The target array includes a periodic array of the features at the minimum design rule which can represent the features in the integrated circuit. The features in the IC are more randomly distributed than the features in the periodic array and can be larger than the minimum critical dimension (CD).

The scatterometry target diffracts the light from the beam and the scattered signal is analyzed. The shape and size (CD) of the feature in the periodic array is determined. A reflectance curve defines diffraction behavior from the periodic array in the target area in a highly non-linear way. Typically, it is not analytically possible to determine the structure in the target area from the reflectance curve. One approach of conventional scatterometry is to model the reflectance curves as a set of library curve sets which have been shown to correlate to the actual geometries of the structures in the periodic array. The structure in the periodic array in turn relates to the CDs of minimum feature sets within the IC circuit being examined.

While scatterometry has been utilized to characterize the geometry of IC structures, it has not heretofore been used to detect end points or process termination in an etch chamber. Detection of process end points is important in the fabrication of IC devices. A method for detection of process termination could lead to tighter tolerances of device features from the processes in the etch machine. Such a method could lead to tighter tolerances between wafers or between batches due to tighter in situ control of etch processing.

As dimensions of IC devices continue to shrink, it becomes important to identify the process end points accurately and decrease the variation of the process. Thus, there is a need for a method of scatterometry with infrared radiation where the nature of the substrate, the quality of chemicals on the substrate of the integrated circuit wafer or products in the gaseous state above the substrate are determined and used to control the etch process. Yet further, there is a need for detection of any of the above by interaction of scattered infrared light from the substrate with the respective absorption bands of each species. The use of such a detection scheme allows greater control over the etching process than conventional methods.

Thus, there is a need to identify etch process end points using a method of scatterometry defined by the detection of the interaction of scattered infrared broad-band light with the absorption bands by either reflection from or transmission through solids or gases on or above the wafer. Further, there is a need to continuously detect species in the vapor or solid phase and be used either to terminate the process or modify the process in midpoint.

SUMMARY OF THE INVENTION

An exemplary embodiment relates to a method of detecting a process end point during etching in the fabrication of an integrated circuit. This method can include receiving a reference signal indicative of an intensity of a light source, collecting a reflection signal reflected off a surface of an integrated circuit wafer, and comparing the reference signal and the reflection signal to locate absorption bands. The absorption bands are indicative of a process end point.

Another exemplary embodiment relates to a method of using scatterometry to detect integrated circuit (IC) process end points in an etch chamber. This method can include reflecting a beam of light off of an integrated circuit surface, and detecting absorption bands using the reflected beam of light. The absorption bands indicate integrated circuit process end points.

Another exemplary embodiment relates to a system for fabricating an integrated circuit in which process end points are detected. This system can include an etching chamber configured to etch an integrated circuit wafer, a light source which projects light in the etching chamber, and a detector which detects a light beam reflected off a surface of the integrated circuit wafer. The detector compares the reflected light beam with a reference signal to locate absorption bands, which are indicative of a process end point.

Other principle features and advantages of the present invention will become apparent to those skilled in the art upon review of the following drawings, the detailed description, and the appended claims.

BRIEF DESCRIPTION OF THE DRAWINGS

The exemplary embodiments will hereafter be described with reference to the accompanying drawings, wherein like numerals denote like elements, and.

DETAILED DESCRIPTION OF EXEMPLARY EMBODIMENTS

In accordance with an exemplary embodiment, broad band infrared radiation between 1 micrometer ($\mu$m) and 20

μm is used in scatterometry to detect integrated circuit (IC) process end points in an etch chamber by detecting the absorption bands of either species of chemicals in the gas phase chemicals within the etching chamber or absorption from substrates exposed during etching.

Figure 1:
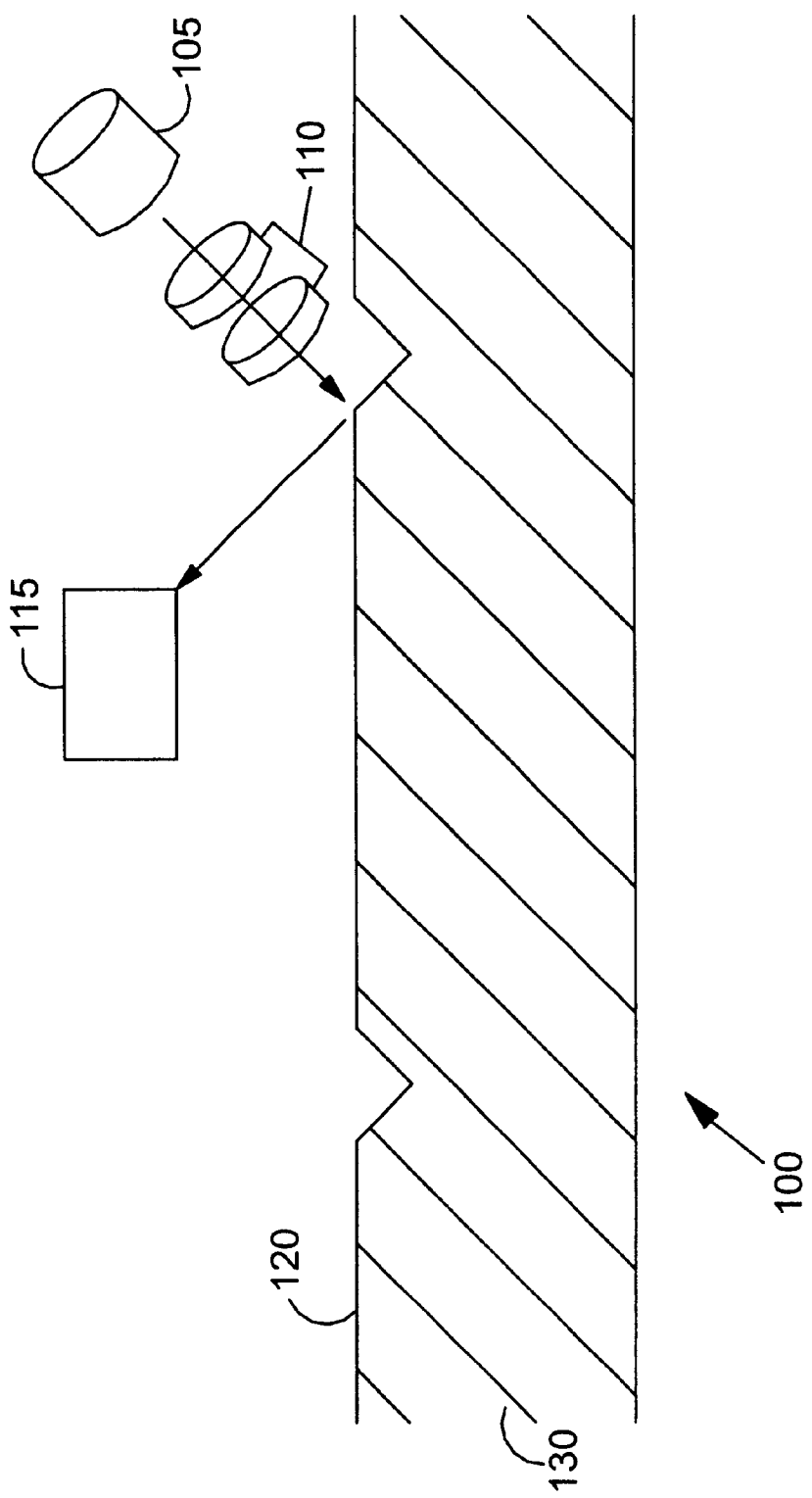
FIG. 1 is a schematic diagram of a scatterometry system in accordance with an exemplary embodiment.

FIG. 1 illustrates a scatterometry system 100 including a light source 105, polarizers 110, and a detector 115. Light source 105 can be an infrared (IR) light source for light or radiation having wavelengths of between 1 μm and 20 μm. Light source 105 can be a light source available commercially from Oriel, Instruments of Stratford, Connecticut, such as, Model No. 6333 Quartz Tungsten Halogen Lamp 100W 3400K covering 1 μm to 3 μm and Model No. 6575 Ceramic Element 22W 1550K covering 1 μm to 20 μm. The irradiance of light source Model No. 6575 is lower than that of Model No. 6333; however Model No. 6333 also has strong output in the visible from 350 nm and above, which can be desirable in case where visible light is necessary.

Light source 105 is focused into a beam for collimation and passed through polarizers 110 to form either s-polarized light or p-polarized light. Two beams are formed for both a reference signal and a sample signal. The reference signal does not go through the chamber and does not reflect off the sample. Instead, the reference signal is reflected off a mirror and collected at detector 115 to determine the baseline intensity of the lamp over wavelength in time. An exemplary reference signal is described below with reference to FIG. 4.

The sample signal is passed through the chamber and is reflected off the sample IC substrate. In the case of the sample beam, interaction with absorption of either gasses in the path of the beam or the IC substrate occurs. After the sample signal is reflected off an IC wafer surface 120, it is also collected at detector 115 where a comparison is made to the reference signal to determine if an absorption peak is detected. Prior to being exposed to detector 115, the light beams for either the reference signal or the sample signal are focused onto a grating which disperses the light in the beam between 1 μm and 20 μm onto an area sensitive detector such as a charge coupled device (CCD) camera or a linear diode array which can detect radiation in the infrared spectrum.

Scatterometry system 100 can utilize the scattered light to detect new chemical species in either gas phase or as solids on exposed surfaces by a change in the characteristic of the scattered light in the absorbing region of the new species. These absorbing bands are typically in the infrared at wavelengths longer than 1 micrometers (μm). The detection of these absorbing bands in either reflection or transmission can signal the exposure of the layer beneath and indicate the condition necessary for the termination of the etching process. Depending on the exact types of layers in the substrate, the detection of absorption from the new species can warrant immediate termination of the etching process or it can be terminated a predetermined amount of time after the initial detection of the new species.

In addition to the necessity for termination based upon the existence of a species, dry etch process termination can be based upon the lack of a species as determined by the loss of the scatterometry signal due to the loss of a characteristic contribution due to the absorption bands of the species. In such a case, it can be that the required species is either the substrate or a secondary product of the chemical processes during the etch process which coats the sides and contributes to the quality of the etch process. These byproduct chemicals are frequently referred to as polymer and are to be distinguished from the photo-resist polymer as they are polymeric compounds formed from the substrate and other chemicals present in the plasma etch chamber at the surface of the wafer.

Gas phase chemicals can absorb light when the light in the beam activates an IR active mode for that molecule. Spectroscopic data exists for the chemicals which may be present during the etch process or which may be used to signal termination of the etch process by either the presence or disappearance of a gas phase chemical. Such spectroscopic data can be used to detect absorption bands and, hence, process and points.

A layer on an IC circuit substrate is modeled as a solid with a complex index of refraction which is represented as n+ik. Here, n is referred to as the real index of refraction and k is called the coeffecient of extinction. When k is non zero, the solid is absorbing. A region where k is non-zero is defined as an absorbing band.

Figure 2A:
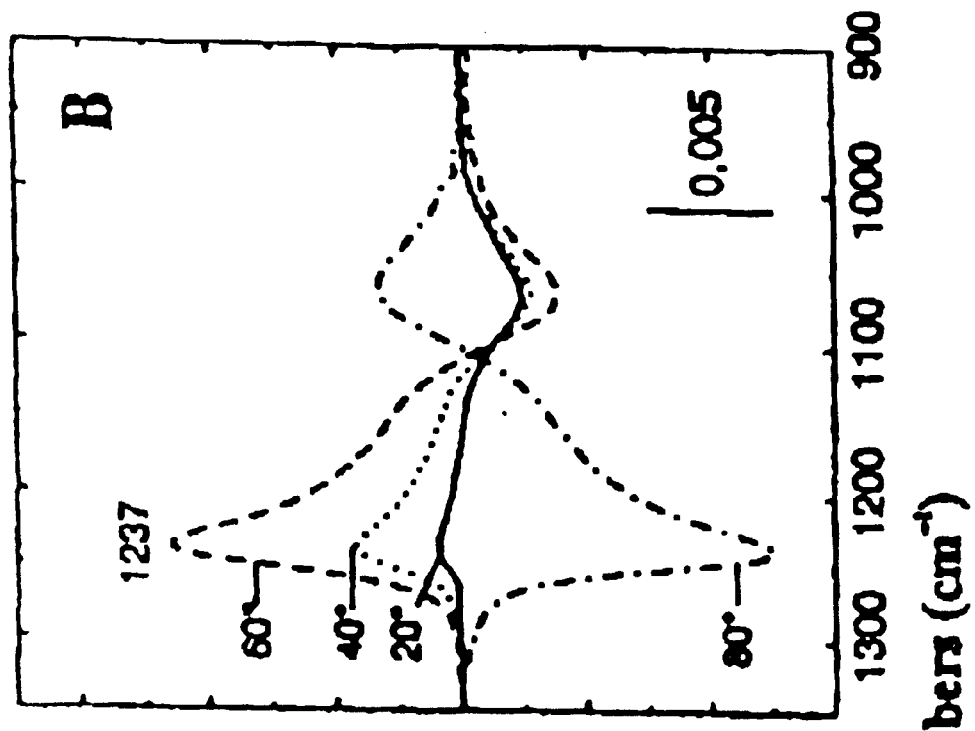
FIGS. 2 A–B are graphs of the absorption spectrum of $SiO_2$ in the infrared for s-polarization (FIG. 2A) and p-polarization (FIG. 2B) at various angles of incidence theta.
Figure 2B:
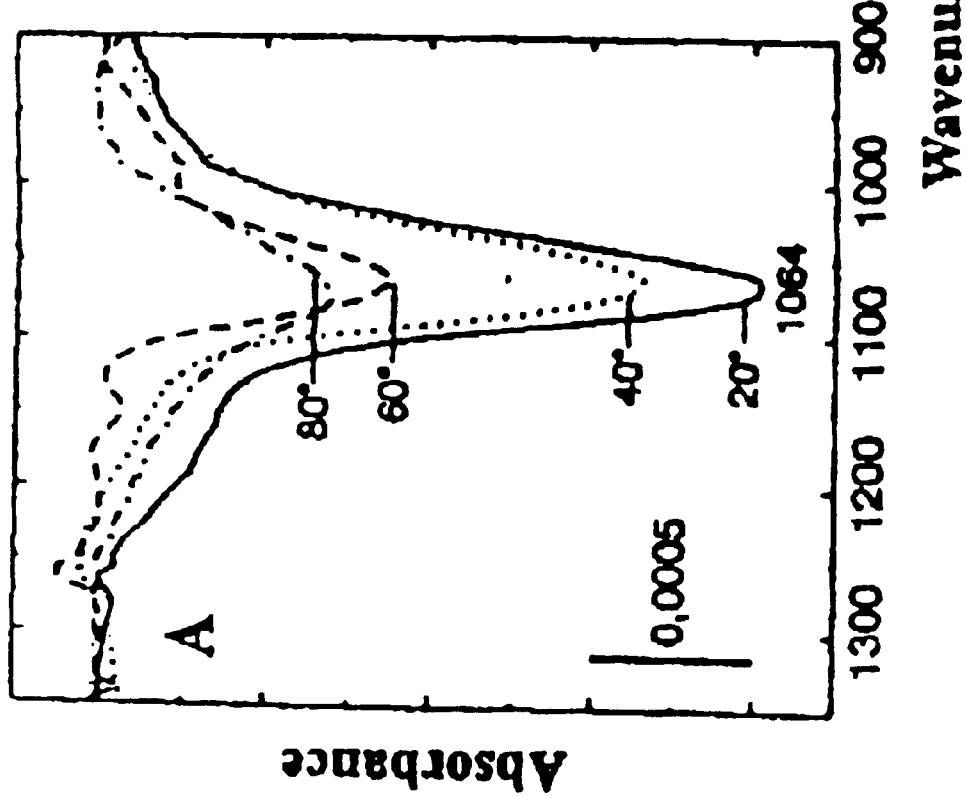

In the region of an absorbing band, the light can be either reflected or absorbed depending on the identity of the band, the angle of incidence and the polarization of the incident light. FIGS. 2A–B illustrates an example of an family of curves for absorption bands for s-polarization (FIG. 2A) and p-polarization (FIG. 2B). In FIG. 2A, with s-polarization, the TO (transverse-optical) band at 1064 $cm^{-1}$ is observed with a strong dip in the spectrum. The dip in the spectrum varies significantly between angles of incidence 20° and 80°.

Figure 3A:
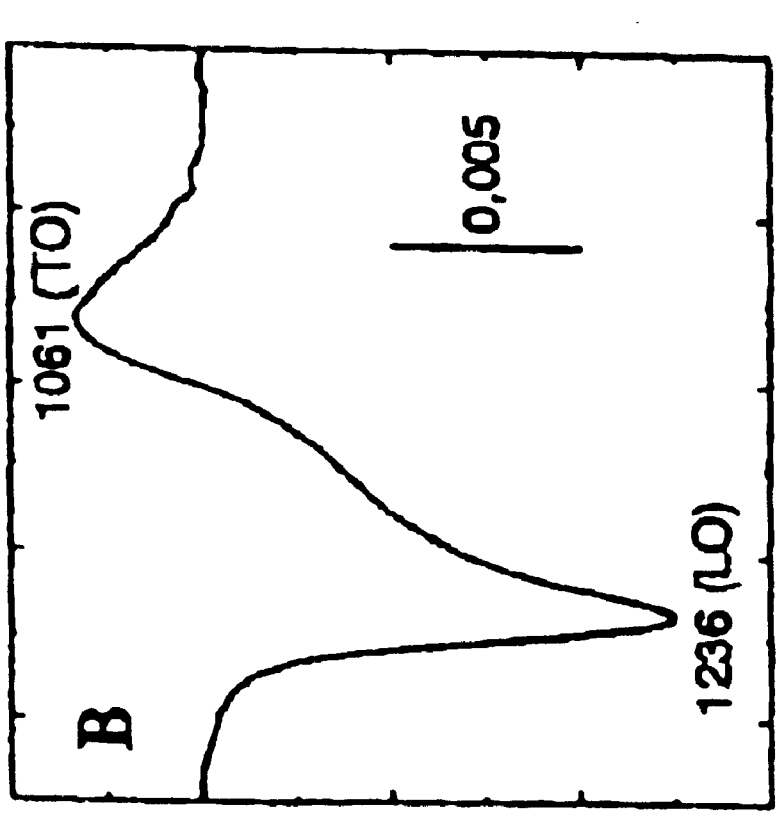
FIGS. 3 A–B are graphs of the absorption spectrum of a 2.94 nm thick $SiO_2$ film on gold (FIG. 3A) and a 3.1 nm thick $SiO_2$ film on silicon (FIG. 3B)
Figure 3B:
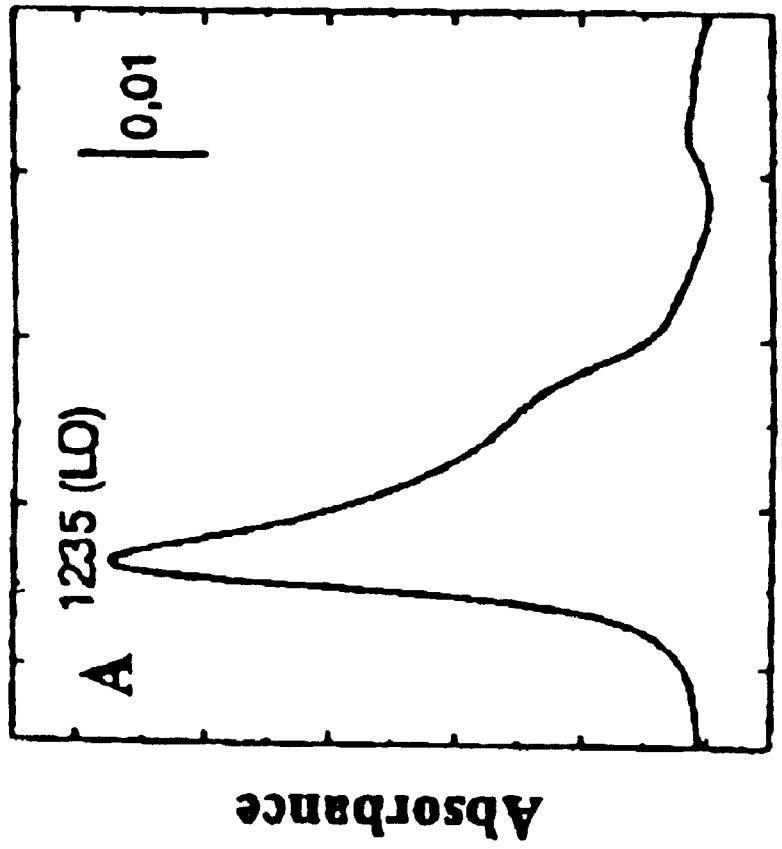

In FIG. 2B, the LO (longitudinal optical) mode is observed at 1237 $cm^{-1}$ using p-polarized radiation. The spectrum shows absorbance occurs in the region of the LO absorption band up to the angle of incidence which exceeds the Brewster angle between 60° and 80°. The character of the reflectivity or absorption in the absorption band is dependent on the nature of the substrates underlying the absorbing layer. For instance, in FIGS. 3A–B, the radiation is p-polarized at an 80° angle of incidence. For the same band, the LO of $SiO_2$ at 1235 $cm^{-1}$, there is a strong reflection peak as shown by a rising signal when the layer under the $SiO_2$ is Au and there is a strong absorption peak shown by a strong dip when the layer under the $SiO_2$ is Si. This absorption band centered at 1235 $cm^{-1}$ corresponds to a 10.04 μm wavelengths when $cm^{-1}$ is converted to wavelength units. Other substrates have absorption bands in the IR such as SiC (12.8 μm) and Alumina (17.24 μm).

Figure 4:
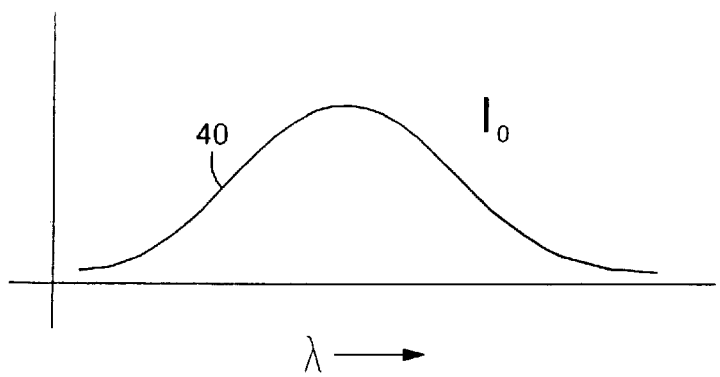
FIG. 4 is a graphical representation of a reference signal used in a scatterometry process in accordance with an exemplary embodiment.

As described above, in an exemplary scatterometry process utilizing scatterometry system 100, light is scattered off one mirror using a lamp serving as an IR source. FIG. 4 illustrates a graphical representation of a reference signal 40 which results from the scattering off the mirror.

Figure 5:
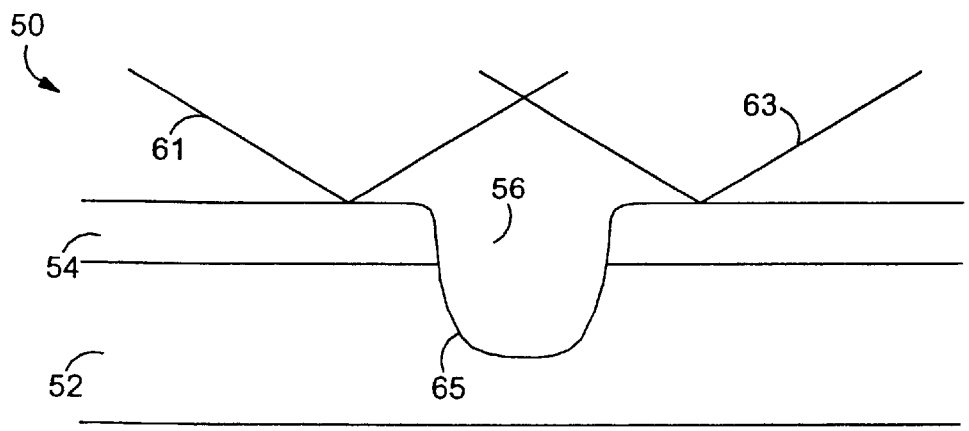
FIG. 5 is a cross-sectional view of a portion of an integrated circuit being subjected to an exemplary infra-red scatterometry beam of light in accordance with another exemplary embodiment.

A second scatterometry signal can be obtained by reflecting a light beam off IC wafer surface 120 of an IC wafer 130 (FIG. 1) while it is undergoing the etch process. FIG. 5 illustrates a portion 50 of an integrated circuit including a substrate 52, a photoresist layer 54, and an etching region 56. A beam of light 61 is projected onto the surface of portion 50 and a beam of reflected light 63 is reflected.

While substrate 52 is etched, certain chemicals are produced, such as, CO, CF, or $CF_2$. The absorbtion signals from these etching chemicals are ignored. When the etching action reaches substrate 52, new chemicals are formed and, in addition, a new exposed surface 65 in etching region 56 is exposed. These new chemicals along with exposed surface 65 lead to a change in reflected signal 63.

Figure 6:
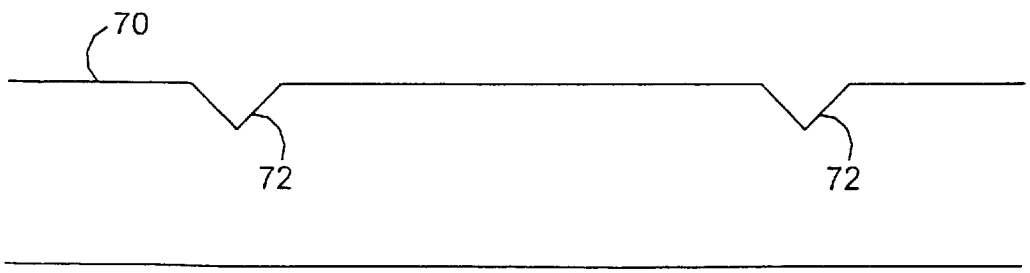
FIG. 6 is a graphical representation of a scatterometry reflection signal having an absorption band in accordance with yet another exemplary embodiment.

A comparison is made between reference signal 40 (described with reference to FIG. 4) and the scatterometry reflection signal (reflection signal 63) by taking the ratio $I_R/I_O$. FIG. 6 illustrates a graph 70 of the comparison between reference signal 40 and scatterometry reflection signal 63. The comparison result leads to dips or peaks in the $I_R/I_O$ which indicate absorption bands 72 (as illustrated in FIG. 6). Detection of these dips or peaks indicates a need to terminate the etching process at locations corresponding to the dips or peaks.

Calculations involved in the comparison of reference signal 40 and scatterometry reflection signal 63 can be done in computer software. For example, National Instruments provides digital acquisition hardware and software for the construction of such a device. Such computer software can be configured to automatically signal an etching control system to indicate a need to terminate etching.

While the embodiments illustrated in the FIGURES and described above are presently preferred, it should be understood that these embodiments are offered by way of example only. Other embodiments may include, for example, different uses for detecting absorption bands. The invention is not limited to a particular embodiment, but extends to various modifications, combinations, and permutations that nevertheless fall within the scope and spirit of the appended claims.

What is claimed is:

1. A method of detecting a process end point during etching in the fabrication of an integrated circuit, the method comprising:

receiving a reference signal indicative of an intensity of a light source;

collecting a reflection signal reflected off a surface of an integrated circuit wafer; and comparing the reference signal and the reflection signal to locate absorption bands, the absorption bands being indicative of a process end point.

2. The method of claim 1, wherein the step of receiving a reference signal indicative of an intensity of a light source comprises collecting a light beam reflected off a mirror at a detector.

3. The method of claim 1, wherein the reference signal does not pass through an etch chamber.

4. The method of claim 1, wherein the surface of the integrated circuit wafer includes an exposed section which indicates a process end point.

5. The method of claim 1, wherein the light source provides light having a wavelength of between 1.0 $\mu$m and 20.0 $\mu$m.

6. The method of claim 1, wherein the reflection signal is an indication of chemicals present during the etching process.

7. The method of claim 1, wherein the collected reflection signal is an indication of absorbed light.

8. A method of using scatterometry to detect integrated circuit (IC) process end points in an etch chamber, the method comprising:

providing a reference signal;

reflecting a beam of light off of an integrated circuit surface; and detecting absorption bands using the reflected beam of light, the absorption bands indicating integrated circuit process end points.

9. A system for fabricating an integrated circuit in which process end points are detected, the system comprising:

an etching chamber configured to etch an integrated circuit wafer;

a light source which projects light in the etching chamber; and a detector which detects a light beam reflected off a surface of the integrated circuit wafer, the detector comparing the reflected light beam with a reference signal to locate absorption bands, the absorption bands being indicative of a process end point.

10. The system of claim 9, further comprising a mirror which reflects a light beam from the light source to provide a reference signal to the detector.

11. The system of claim 9, wherein the detector detects a new chemical produced in the etching chamber, the new chemical being produced in the formation of an etching end point.

12. The system of claim 9, further comprising polarizers disposed between the light source and the integrated circuit wafer.

13. The system of claim 9, wherein the detector is communicatively coupled to a computing device.

* * * * *